(12) United States Patent
Fujii et al.

(10) Patent No.: US 9,661,785 B2
(45) Date of Patent: May 23, 2017

(54) POWER CONVERSION APPARATUS

(71) Applicant: TOSHIBA MITSUBISHI-ELECTRIC IND. SYSTEMS CORP., Chuo-ku (JP)

(72) Inventors: Yosuke Fujii, Tokyo (JP); Nobuhiro Takahashi, Tokyo (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 20 days.

(21) Appl. No.: 14/580,842

(22) Filed: Dec. 23, 2014

(65) Prior Publication Data

US 2015/0109737 A1 Apr. 23, 2015

Related U.S. Application Data

(63) Continuation of application No. PCT/JP2012/066744, filed on Jun. 29, 2012.

(51) Int. Cl.
| | |
|---|---|
| H05K 7/20 | (2006.01) |
| H02M 1/32 | (2007.01) |
| F28F 23/02 | (2006.01) |
| F28D 15/06 | (2006.01) |
| F28D 15/02 | (2006.01) |

(52) U.S. Cl.
CPC ..... *H05K 7/20336* (2013.01); *F28D 15/0275* (2013.01); *F28D 15/06* (2013.01); *F28F 23/02* (2013.01); *H02M 1/32* (2013.01); *H05K 7/20936* (2013.01); *H05K 7/20945* (2013.01); *H02M 2001/327* (2013.01)

(58) Field of Classification Search
CPC ............... H05K 7/209; H05K 7/20909; H05K 7/20936; H05K 7/20945; F28D 15/06
See application file for complete search history.

(56) References Cited

U.S. PATENT DOCUMENTS

| | | | | |
|---|---|---|---|---|
| 2,948,518 | A | * 8/1960 | Kraus | ................ H05K 7/20145 165/121 |
| 4,311,129 | A | 1/1982 | Kakizaki et al. | |
| 5,379,831 | A | * 1/1995 | Carpenter | ........... F28D 15/0258 165/104.14 |

(Continued)

FOREIGN PATENT DOCUMENTS

| | | |
|---|---|---|
| FR | 2 543 272 A1 | 9/1984 |
| JP | 3-60388 A | 3/1991 |

(Continued)

OTHER PUBLICATIONS

Japanese Office Action issued Aug. 18, 2015 in Patent Application No. 2014-522331 (with English Translation).

(Continued)

*Primary Examiner* — Robert J Hoffberg
(74) *Attorney, Agent, or Firm* — Oblon, McClelland, Maier & Neustadt, L.L.P.

(57) ABSTRACT

A power conversion apparatus includes an electrical circuit including a heat source, a heat pipe cooler in which a refrigerant is enclosed, the heat pipe cooler configured to cool the heat source, a freeze determiner configured to determine whether the refrigerant is frozen, and an output limiter configured to limit output when the freeze determiner determines that the refrigerant is frozen.

11 Claims, 3 Drawing Sheets

(56) References Cited

U.S. PATENT DOCUMENTS

| | | | | |
|---|---|---|---|---|
| 5,505,379 | A * | 4/1996 | Wagner | F24F 13/075 236/101 D |
| 5,651,414 | A * | 7/1997 | Suzuki | F28D 15/0275 165/104.14 |
| 5,984,196 | A * | 11/1999 | Godsey | G05D 23/08 236/49.5 |
| 6,330,155 | B1 * | 12/2001 | Remsburg | H05K 7/20154 165/276 |
| 7,355,848 | B1 * | 4/2008 | Hodge | H05K 7/20127 165/185 |
| 2001/0037880 | A1 * | 11/2001 | Solondz | F28D 15/06 165/274 |
| 2013/0000871 | A1 * | 1/2013 | Olson | G05D 23/01 165/104.26 |
| 2014/0290929 | A1 * | 10/2014 | Opila | F28D 15/02 165/287 |

FOREIGN PATENT DOCUMENTS

| | | |
|---|---|---|
| JP | H06-276742 A1 | 9/1994 |
| JP | 7-180982 A | 7/1995 |
| JP | 9-199648 A | 7/1997 |
| JP | H11-341813 A1 | 12/1999 |
| JP | 2001-175943 A1 | 6/2001 |
| JP | 2008-211956 A1 | 9/2008 |
| JP | 2012-002388 A1 | 1/2012 |
| WO | WO 00/57471 A1 | 9/2000 |

OTHER PUBLICATIONS

Extended European Search Report issued on Dec. 17, 2015 in European Patent Application No. 12880159.4.
Office Action issued May 26, 2015 in Japanese Patent Application No. 2014-522331 (with English language translation).
International Preliminary Report on Patentability issued Jan. 8, 2015 in PCT/JP2012/066744 (submitting English translation only).
Written Opinion issued Sep. 25, 2012 in PCT/JP2012/066744 (submitting English translation only, Japanese version previously filed Dec. 23, 2014).
International Search Report issued Sep. 25, 2012 for PCT/JP2012/066744 filed Jun. 29, 2012 with English Translation.
Written Opinion issued Sep. 25, 2012 for PCT/JP2012/066744 filed Jun. 29, 2012.

* cited by examiner

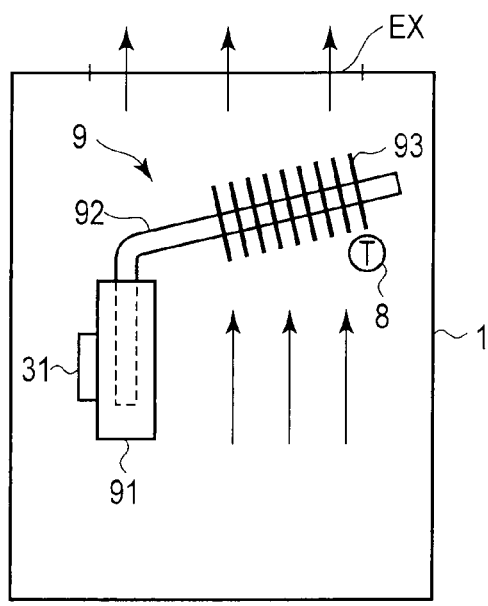
F I G. 2
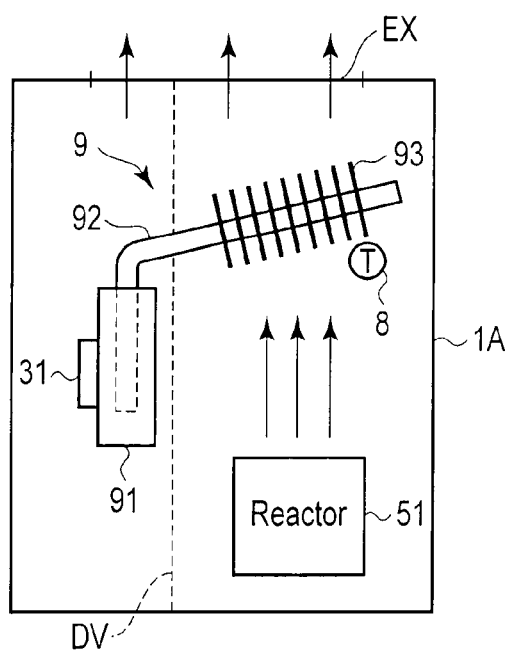
F I G. 3

POWER CONVERSION APPARATUS

CROSS REFERENCE TO RELATED APPLICATIONS

This application is a Continuation Application of PCT Application No. PCT/JP2012/066744, filed Jun. 29, 2012, the entire contents of which are incorporated herein by reference.

BACKGROUND OF THE INVENTION

1. Field of the Invention

The present invention relates generally to a power conversion apparatus using a heat pipe cooler.

2. Description of the Related Art

In a power conversion apparatus, generally, a semiconductor element is employed as a switching element. As a known method for cooling the semiconductor element, a heat pipe cooler is used. To cool the semiconductor element, the method uses an effect of thermal energy which moves from a high-temperature part to a low-temperature part through a refrigerant liquid (hereinafter, referred to as a refrigerant) enclosed in a heat pipe by the temperature difference between both ends of the heat pipe.

In a case where the heat pipe cooler is used in cold environment such as outdoors in cold regions, the refrigerant on the low-temperature side is frozen when the temperature on the low-temperature side in the heat pipe is less than or equal to the refrigerant freezing point. If the refrigerant is frozen, the transfer of thermal energy is severely disturbed. Thus, the heat pipe cooler cannot sufficiently exert its cooling effect. Therefore, when the power conversion apparatus is operated in a state where the refrigerant of the heat pipe cooler is frozen, the semiconductor element might be destroyed due to over-allowable temperature as the semiconductor element cannot be sufficiently cooled. To prevent the refrigerant of the heat pipe from freezing, various measures have been taken. For example, a power conversion apparatus in which a heater is attached to a heat pipe cooler is disclosed (For example, refer to Jpn. Pat. Appln. KOKAI Publication No. 6-276742).

However, the power conversion apparatus in which the heater is attached to the heat pipe cooler cannot be operated until the refrigerant is defrosted by the heater since the cooling performance of the heat pipe cooler is reduced during operation.

BRIEF SUMMARY OF THE INVENTION

It is an object of the present invention to provide a power conversion apparatus capable of starting operation even when the refrigerant of a heat pipe cooler is frozen.

A power conversion apparatus according to an aspect of the present invention comprises an electrical circuit including a heat source; a heat pipe cooler in which a refrigerant is enclosed, the heat pipe cooler configured to cool the heat source; a freeze determiner configured to determine whether the refrigerant is frozen; and an output limiter configured to limit output when the freeze determiner determines that the refrigerant is frozen.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 2 is a structural diagram showing a structure of a heat pipe cooler mounted on a power conversion apparatus 1 according to the first embodiment.

FIG. 3 is a structural diagram showing a structure of a heat pipe cooler mounted on a power conversion apparatus according to a second embodiment of the present invention.

DETAILED DESCRIPTION OF THE INVENTION

Embodiments will be described hereinafter with reference to the accompanying drawings.

First Embodiment

Figure 1:
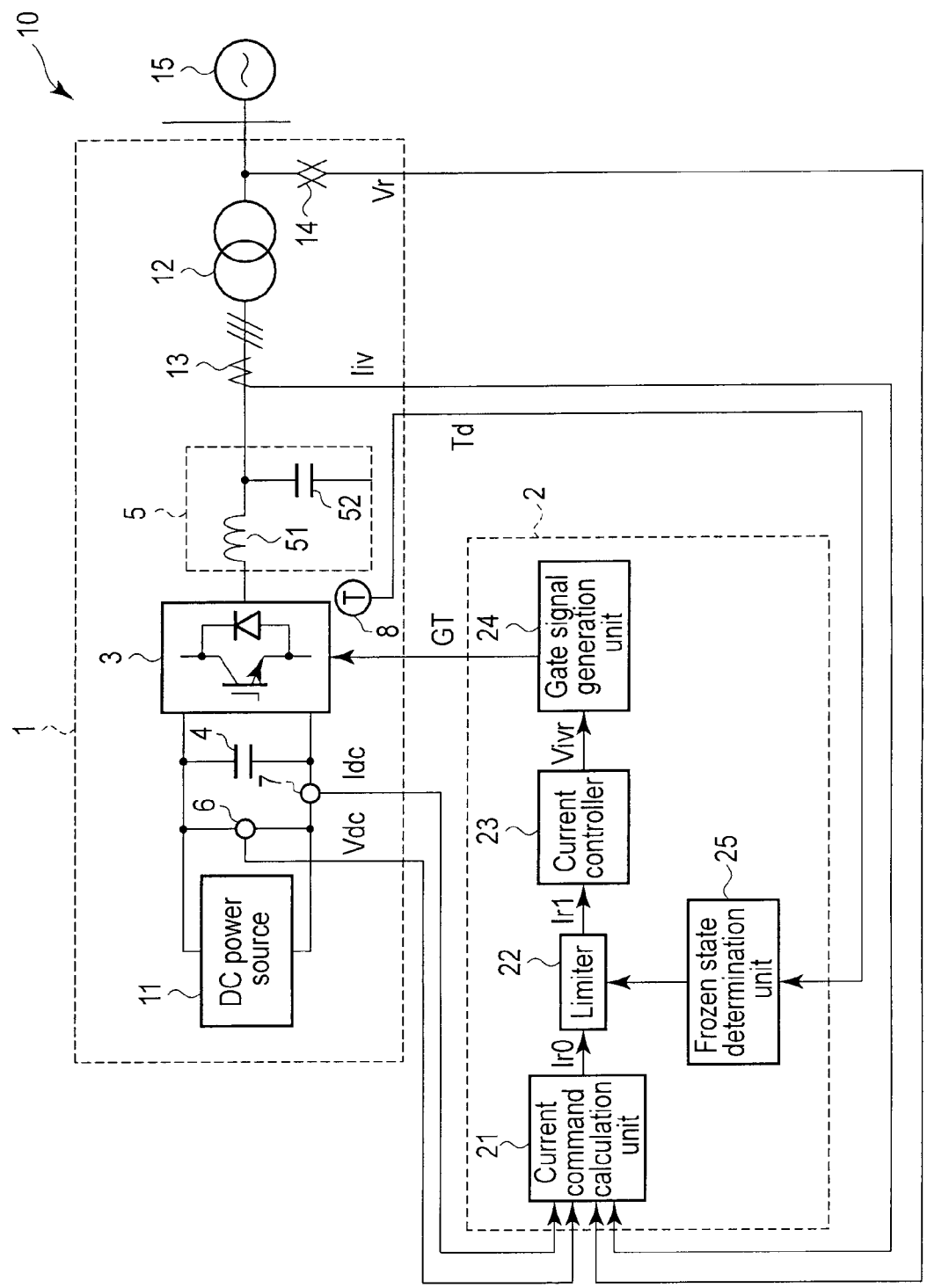
FIG. 1 is a structural diagram showing a structure of a power supply system according to a first embodiment of the present invention.

FIG. 1 is a structural diagram showing a structure of a power supply system 10 according to a first embodiment of the present invention. FIG. 2 is a structural diagram showing a structure of a heat pipe cooler 9 mounted on a power conversion apparatus 1 according to the embodiment. The arrows shown in FIG. 2 indicate natural convection. In the drawings, the same portions are denoted by the same reference numbers. Thus, the detailed explanation of such portions is omitted, and different portions are mainly explained. In the subsequent embodiments, the overlapping explanation is omitted in the same manner.

The power supply system 10 includes the power conversion apparatus 1, a controller 2 and a DC (direct current) power source 11. The power supply system 10 is interconnected with an AC (alternating current) power system 15 including an AC power source.

The DC power source 11 supplies DC power to the power conversion apparatus 1. The DC power source 11 may be anything which can supply DC power to the power conversion apparatus 1. For example, the DC power source 11 is a secondary cell, a photovoltaic (PV) cell (solar cell) or a fuel cell.

The power conversion apparatus 1 converts DC power supplied from the DC power source 11 into AC power synchronized with the AC power system 15. The power conversion apparatus 1 supplies AC power to the AC power system 15.

The controller 2 outputs a gate signal GT to an inverter circuit 3 and controls the AC power output from the power conversion apparatus 1.

An interconnection transformer 12 is housed in the power conversion apparatus 1, or is provided outside the power conversion apparatus 1. The interconnection transformer 12 is a device for interconnecting, to the AC power system 15, the AC power which is output via an AC filter 5 from the inverter circuit 3.

An AC current detector 13 is a detector for measuring an output current Iiv of the power conversion apparatus 1. The AC current detector 13 outputs the detected output current Iiv to the controller 2 as a detection signal. The AC current detector 13 is provided inside the power conversion apparatus 1. When the interconnection transformer 12 is housed in the power conversion apparatus 1, the AC current detector 13 is provided in the electrical path between the interconnection transformer 12 and the AC power system 15. When the interconnection transformer 12 is provided outside the power conversion apparatus 1, the AC current detector 13 is provided in the electrical path between the AC filter 5 and the interconnection transformer 12.

An AC voltage detector 14 is a detector for measuring an output voltage Vr of the power conversion apparatus 1. The AC voltage detector 14 outputs the detected output voltage Vr of the power conversion apparatus 1 to the controller 2 as a detection signal.

The power conversion apparatus 1 includes the inverter circuit 3, a smoothing capacitor 4, the AC filter 5, a DC voltage detector 6, a DC current detector 7, a temperature sensor 8, the heat pipe cooler 9, the AC current detector 13 and the AC voltage detector 14. In some cases, the power conversion apparatus 1 includes the interconnection transformer 12.

The inverter circuit 3 includes a semiconductor element 31 which is a switching element. The inverter circuit 3 is an electrical circuit to which pulse width modulation (PWM) control is applied. In the inverter circuit 3, the switching element is driven (a switching operation is conducted) by a gate signal Gt output from the controller 2. Accordingly, the inverter circuit 3 performs power conversion.

The smoothing capacitor 4 is provided on the DC side of the inverter circuit 3. The smoothing capacitor 4 smoothes a DC voltage which is fluctuated by the driving of the switching element of the inverter circuit 3.

The AC filter 5 is a filter circuit including a reactor 51 and a capacitor 52. The AC filter 5 removes harmonics output from the inverter circuit 3.

The DC voltage detector 6 is a detector for measuring a DC voltage Vdc applied to the DC side of the inverter circuit 3. The DC voltage detector 6 outputs the detected DC voltage Vdc to the controller 2 as a detection signal.

The DC current detector 7 is a detector for measuring a DC current Idc input to the DC side of the inverter circuit 3. The DC current detector 7 outputs the detected DC current Idc to the controller 2 as a detection signal.

The temperature sensor 8 is provided on the thermal radiation fin 93 side of the heat pipe cooler 9 for cooling the semiconductor element 31 constituting the inverter circuit 3, or is provided near the thermal radiation fins 93. The thermal radiation fins 93 are provided in the upper part of the heat pipe cooler 9. The temperature of the upper part of the heat pipe cooler 9 is low. Thus, the temperature sensor 8 is preferably provided on the thermal radiation fin 93 side on which the refrigerant is easily frozen. The temperature sensor 8 detects a temperature Td for determining whether or not the refrigerant enclosed in the heat pipe cooler 9 is frozen. The temperature sensor 8 outputs the detected temperature to the controller 2 as a detection signal.

The heat pipe cooler 9 includes a base plate 91, a heat pipe 92 and the thermal radiation fins 93. The heat pipe cooler 9 cools the semiconductor element 31 which is a heat source constituting the inverter circuit 3.

The semiconductor element 31 is joined on the base plate 91. The heat pipe 92 is inserted into the base plate 91 such that the lower part of the heat pipe 92 is buried under the base plate 91. A volatile liquid refrigerant is enclosed in the heat pipe 92. The refrigerant is, for example, purified water, a liquid in which a chemical component for preventing freeze is mixed in purified water, or a chemical substance such as chlorofluorocarbon. The thermal radiation fins 93 are provided in the upper part of the heat pipe 92.

Now, this specification explains the principle in which the semiconductor element 31 is cooled by the heat pipe cooler 9.

The base plate 91 absorbs heat generated by the semiconductor element 31. The base plate 91 transmits the heat absorbed from the semiconductor element 31 to the heat pipe 92. At this time, the liquid refrigerant accumulated in the lower part (high-temperature side) of the heat pipe 92 is heated by the heat transmitted from the heatsink 91, and turns into steam. The steam refrigerant moves to the upper part (low-temperature side) of the heat pipe 92. The temperature of the upper part of the heat pipe 92 is low.

After the heated steam refrigerant moves to the upper part (low-temperature side) of the heat pipe 92, the temperature of the upper part (low-temperature side) of the heat pipe 92 is higher than the surrounding temperature. When the temperature of the upper part of the heat pipe 92 is higher than the surrounding temperature, a thermal energy is released from the thermal radiation fins 93 provided in the upper part (low-temperature side) of the heat pipe 92.

The steam refrigerant is cooled when the radiation fins 93 are cooled. The cooling air which is heated by cooling the radiation fins 93 is discharged to outside from a radiation exhaust outlet EX provided in the upper part of the power conversion apparatus 1. When the refrigerant is cooled, the refrigerant returns from steam to liquid. The refrigerant returned to liquid passes through the inner part of the heat pipe 9 by the temperature difference, and returns from the upper part (low-temperature side) of the heat pipe 92 to the lower part (high-temperature part) of the heat pipe 92. By repeating a series of these operations, the heat pipe cooler 9 cools the semiconductor element 31.

The controller 2 controls the output power of the power conversion apparatus 1 on the basis of the output current Iiv which is the output current of the power conversion apparatus 1 and is detected by the AC current detector 13, the output voltage Vr which is the output voltage of the power conversion apparatus 1 and is detected by the AC voltage detector 14, the DC voltage Vdc detected by the DC voltage detector 6, the DC current Idc detected by the DC current detector 7 and the temperature Td detected by the temperature sensor 8.

The controller 2 includes a current command calculation unit 21, a limiter 22, a current controller 23, a gate signal generation unit 24 and a frozen state determination unit 25.

The current command calculation unit 21 calculates a current command value Ir0 on the basis of the output current Iiv, the output voltage Vr, the DC voltage Vdc and the DC current Idc. The current command value Ir0 is a command value for the output current Iiv of the inverter circuit 3. The current command calculation unit 21 outputs the calculated current command value Ir0 to the limiter 22.

The frozen state determination unit 25 determines whether or not the refrigerant of the heat pipe cooler 9 is frozen on the basis of the temperature Td detected by the temperature sensor 8. The state in which the refrigerant is frozen means a state in which the heat pipe cooler 9 cannot fully perform the cooling function. In the frozen state determination unit 25, the highest temperature at which the refrigerant is determined as frozen is preset as a reference temperature. When the temperature Td detected by the temperature sensor 8 is lower than the preset reference temperature, the frozen state determination unit 25 determines that the refrigerant is frozen. When the temperature Td detected by the temperature sensor 8 is higher than the preset reference temperature, the frozen state determination unit 25 determines that the refrigerant is not frozen.

When the frozen state determination unit 25 determines that the refrigerant is frozen, the frozen state determination unit 25 outputs, to the limiter 22, a signal for placing limits on the current command value Ir0 calculated by the current command calculation unit 21. When the frozen state determination unit 25 determines that the refrigerant is not frozen, the frozen state determination unit 25 outputs, to the limiter 22, a signal for placing no limits on the current command value Ir0 calculated by the current command calculation unit 21. The frozen state determination unit 25 may be configured to output no signal in one of the case where limits are applied by the limiter 22 and the case where limits are not applied by the limiter 22.

In the limiter 22, the maximum current which can be output when the refrigerant of the heat pipe cooler 9 is frozen is set as the upper limit. The maximum current is the maximum output current of the inverter circuit 3 with which the heat pipe cooler 9 having a frozen refrigerant can fully cool the semiconductor element 31 constituting the inverter circuit 3. In other words, the maximum current is the maximum current which can be continuously output by the inverter circuit 3 without destruction of the semiconductor element 31 due to overheat by the heat pipe cooler 9 having a frozen refrigerant.

When the frozen state determination unit 25 determines that the refrigerant is frozen, the limiter 22 limits the current command value Ir0 calculated by the current command calculation unit 21 with the setup upper limit. The limiter 22 outputs the limited current command value Ir1 to the current controller 23. On the other hand, when the frozen state determination unit 25 determines that the refrigerant is not frozen, the limiter 22 outputs a current command value Ir1 which does not limit the current command value Ir0 calculated by the current command calculation unit 21 to the current controller 23. In this case, the current command value Ir1 which is output from the limiter 22 is the same as the current command value Ir0 calculated by the current command calculation unit 21.

In the current controller 23, the current command value Ir1 is input from the current command calculation unit 21 through the limiter 22. The current controller 23 calculates a voltage command value Vivr for controlling the output current Iiv such that the output current of the inverter circuit 3 follows the current command value Ir1. The voltage command value Vivr is a command value for the output voltage of the inverter circuit 3. The current controller 23 outputs the calculated voltage command value Vivr to the gate signal generation unit 24.

The gate signal generation unit 24 generates a gate signal Gt on the basis of the voltage command value Vivr calculated by the current controller 23. The gate signal generation unit 24 outputs the generated gate signal Gt to the inverter circuit 3. The gate signal Gt drives the switching element of the inverter circuit 3. In this manner, the output voltage of the inverter circuit 3 is controlled.

The following effects can be obtained from the present embodiment.

Even when the refrigerant of the heat pipe cooler 9 is frozen, the cooling performance can be exerted to some extent as the base plate 91 is provided. Moreover, since the temperature of the inner side of the power conversion apparatus 1 is low to the extent that the refrigerant is frozen, it is possible to maintain the allowable temperature of the semiconductor element 31 of the inverter circuit 3 or lower temperatures.

The power conversion apparatus 1 determines whether or not the refrigerant of the heat pipe cooler 9 is frozen. When the power conversion apparatus 1 determines that the refrigerant is frozen, a safe operation can be performed by placing the upper limit on the current command value Ir1 by the limiter 22 even in a state where the refrigerant of the heat pipe cooler 9 is frozen. Thus, the power conversion apparatus 1 is suitable for a power conversion apparatus in which prompt activation is required even with small output such as a power conditioning system (PCS) for photovoltaic generation.

After the operation is started, the heat pipe cooler 9 is heated by the semiconductor element 31 or various devices mounted on the power conversion apparatus 1. Accordingly, the refrigerant is defrosted. By detecting the defrosting of the refrigerant through the temperature sensor 8, the power conversion apparatus 1 cancels the limits which are applied by the limiter 22 on the current command value Ir1. In this manner, the power conversion apparatus 1 can be switched to a normal operation which performs output without limits by the limiter 22.

Second Embodiment

FIG. 3 is a structural diagram showing a structure of a heat pipe cooler 9 mounted on a power conversion apparatus 1A according to a second embodiment of the present invention. The arrows shown in FIG. 3 indicate natural convection.

The present embodiment is the same as the first embodiment except that the power conversion apparatus 1 of the first embodiment shown in FIG. 2 is replaced by the power conversion apparatus 1A shown in FIG. 3.

The power conversion apparatus 1A includes a structure in which a reactor 51 of an AC filter 5 is provided on the lower side of thermal radiation fins 93 of the heat pipe cooler 9 and a dividing plate DV is provided in the power conversion apparatus 1 of the first embodiment shown in FIG. 2. In the other structures, the power conversion apparatus 1A is the same as the power conversion apparatus 1 of the first embodiment.

The reactor 51 is provided on the windward of the natural convection which is generated inside the power conversion apparatus 1 and which flows from the lower part to the upper part relative to the heat pipe cooler 9. The reactor 51 is a heat source for heating the heat pipe cooler 9.

The dividing plate DV is provided for separating a semiconductor element 31 which is a heat source from the reactor 51 which is a heat source for the purpose of dividing the pollution level of air, etc.

Now, this specification explains influence which is induced on the heat pipe cooler 9 by the position of the reactor 51.

When the power conversion apparatus 1A is started in a state where the refrigerant of the heat pipe cooler 9 is frozen, initially, the power conversion apparatus 1A is operated by a current command value Ir1 limited by a limiter 22. After the power conversion apparatus 1A starts, the reactor 51 is heated by the current which is output from the inverter circuit 3. The air heated by the application of heat to the reactor 51 moves upward, thereby occurring convection from the lower part toward the upper part of the power conversion apparatus 1A. The convection of the heated air heats the heat pipe cooler 9 provided on the upper side of the reactor 51. The application of heat to the heat pipe cooler 9 stimulates defrosting of the enclosed frozen refrigerant. When the power conversion apparatus 1A determines that the refrigerant of the heat pipe cooler 9 is defrosted, the limits which are placed on the current command value Ir1 by the limiter 22 are cancelled. In this manner, the power conversion apparatus 1A is switched to a normal operation to which limits are not applied by the limiter 22.

The temperature of the air heated by the heat generated by the reactor 51 is sufficiently low compared to the temperature of the semiconductor element 31. Therefore, even the air heated by the reactor 51 has little influence on the effect which cools the thermal radiation fins 93 of the heat pipe cooler 9.

The following effects can be obtained from the present embodiment in addition to the effects of the first embodiment.

The defrosting of the frozen refrigerant of the heat pipe cooler 9 can be accelerated by allocating the reactor 51 on the windward of the air convection which is occurred inside the power conversion apparatus 1 such that the heat pipe cooler 9 is heated.

By employing a device constituting the electrical circuit such as the reactor 51 as a device for heating the heat pipe cooler 9, power loss is suppressed compared to a heater. There is no danger that the heat pipe cooler 9 is heated to the extent that its cooling performance is disturbed like heating by a heater.

Third Embodiment

Figure 4:
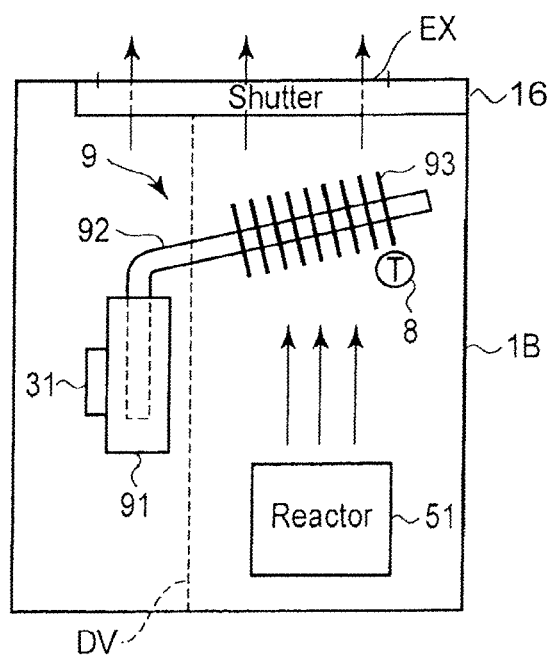
FIG. 4 is a structural diagram showing a structure of a heat pipe cooler mounted on a power conversion apparatus according to a third embodiment of the present invention.

FIG. 4 is a structural diagram showing a structure of a heat pipe cooler 9 mounted on a power conversion apparatus 1B according to a third embodiment of the present invention. The arrows shown in FIG. 4 indicate natural convection.

The present embodiment is the same as the second embodiment except that the power conversion apparatus 1A of the second embodiment shown in FIG. 3 is replaced by the power conversion apparatus 1B shown in FIG. 4.

The power conversion apparatus 1B includes a structure in which a shutter 16 is provided such that an exhaust outlet EX is blocked in the power conversion apparatus 1A of the second embodiment shown in FIG. 3. In the other structures, the power conversion apparatus 1B is the same as the power conversion apparatus 1A of the second embodiment.

The shutter 16 is a bimetal shutter which opens and closes the exhaust outlet EX in accordance with the temperature of the inner side of the power conversion apparatus 1B. The bimetal shutter is a device which automatically effects opening and closing operations in accordance with the temperature, using two types of metals which are different in the rate of thermal expansion. At a temperature at which the refrigerant of the heat pipe cooler 9 is presumably frozen, the shutter 16 blocks the exhaust outlet EX. At a temperature at which the refrigerant of the heat pipe cooler 9 is not presumably frozen, the shutter 16 opens the exhaust outlet EX.

Now, this specification explains influence which is induced on the heat pipe cooler 9 by the shutter 16.

When the power conversion apparatus 1B is started in a state where the refrigerant of the heat pipe cooler 9 is frozen, initially, the power conversion apparatus 1B is operated by a current command value Ir1 to which limits are applied by a limiter 22. After the power conversion apparatus 1B starts, various devices mounted inside the power conversion apparatus 1B including a reactor 51 generate heat. As a result of the heat generation, the internal temperature of the power conversion apparatus 1B rises. When the internal temperature of the power conversion apparatus 1B rises, the heated air attempts to exit via the exhaust outlet EX.

When the internal temperature of the power conversion apparatus 1B is a temperature at which the refrigerant of the heat pipe cooler 9 is frozen, heat is not released since the shutter 16 blocks the exhaust outlet EX. Accordingly, the internal temperature of the power conversion apparatus 1B further rises. In this manner, the defrosting of the refrigerant of the heat pipe cooler 9 is stimulated.

When the internal temperature of the power conversion apparatus 1B rises to a temperature at which the refrigerant of the heat pipe cooler 9 is completely defrosted, the shutter 16 opens the exhaust outlet EX. Thus, the heat of the inner side of the power conversion apparatus 1B is released. When the power conversion apparatus 1B determines that the refrigerant of the heat pipe cooler 9 is defrosted, the limits which are placed on the current command value Ir1 by the limiter 22 are cancelled. In this manner, the power conversion apparatus 1B is switched to a normal operation to which limits are not applied by the limiter 22.

The following effects can be obtained from the present embodiment in addition to the effects of the second embodiment.

It is possible to accelerate the defrosting of the frozen refrigerant of the heat pipe cooler 9 by providing the shutter 16 which blocks the exhaust outlet EX in a state where the internal temperature of the power conversion apparatus 1B is less than or equal to a temperature at which the refrigerant of the heat pipe cooler 9 is frozen.

In the above embodiments, the power conversion apparatuses 1 to 1B are not limited to the explained structures. In the embodiments, the controller 2 is explained as a structure separated from the power conversion apparatuses 1 to 1B. However, the controller 2 may be incorporated into the power conversion apparatuses 1 to 1B.

In each embodiment, the interconnection transformer 12 may not be provided in the power supply system 10. Regardless of with or without the interconnection transformer 12, one of an interconnection transformer and an interconnection reactor may be provided in the power conversion apparatuses 1 to 1B, or both of them may be provided in the power conversion apparatuses 1 to 1B. The interconnection transformer and the interconnection reactor may be integrally formed with the reactor 51 of the AC filter 5. The AC voltage detector 14 can be provided anywhere as long as the system voltage Vr of the system bus 15 is measured. A chopper circuit or a DC reactor which adjusts the DC voltage may be provided on the DC side of the power conversion apparatuses 1 to 1B.

In each embodiment, the temperature sensor 8 is provided in the thermal radiation fins 93. However, the temperature sensor 8 may be provided anywhere in the power conversion apparatus 1. For example, the temperature sensor 8 may be provided in the heatsink 91. The temperature sensor 8 has to be able to measure a temperature which can determine whether or not the refrigerant of the heat pipe cooler 9 is frozen. The temperature sensor 8 is not necessarily able to measure a temperature. For example, the temperature sensor 8 may be configured to merely output a contact signal indicating whether the temperature is higher or lower than the temperature at which the refrigerant of the heat pipe cooler 9 is frozen.

In the embodiments, the power conversion apparatuses 1 to 1B are explained as performing natural air cooling by natural convection. However, forced air cooling using a cooling fan may be employed. By considering the convection generated by forced air cooling in the same manner as the natural convection in natural air cooling, the power conversion apparatuses 1 to 1B by forced air cooling can be structured in the same manner.

In each embodiment, limits may be placed on the current command value Ir0 by the limiter 22 in accordance with the temperature gradually or proportionally. This structure is also applied to the limit cancellation of the current command value Ir0 by the limiter 22 after the refrigerant is defrosted.

In the embodiments, the output current of the power conversion apparatuses 1 to 1B is limited when the apparatuses determine that the refrigerant of the heat pipe cooler 9 is frozen. However, it is possible to use an electrical quantity other than current such as output power or output voltage as long as the output from the power conversion apparatuses 1 to 1B is limited.

In the embodiments, the power conversion apparatuses 1 to 1B are explained as inverters which convert DC power to AC power. However, the power conversion apparatuses 1 to 1B may be converters which convert AC power to DC power. The output on the DC side may be limited by the structure including the converter when the refrigerant of the heat pipe cooler 9 is frozen.

In the second and third embodiments, the reactor 51 is used as a heat source. However, the heat source is not limited to this example. The heat source may be anything as long as it is a device which constitutes the electrical circuit (inverter circuit 3), generates heat by the operation of the power conversion apparatuses 1A and 1B, and generates heat to the extent that the cooling performance of the heat pipe cooler 9 is not disturbed after the refrigerant of the heat pipe cooler 9 is defrosted. For example, when an interconnection transformer or an interconnection reactor may be mounted on the power conversion apparatuses 1A and 1B, those may be used as a heat source.

In the third embodiment, the reactor 51 is allocated so as to heat the refrigerant of the heat pipe cooler 9, and the shutter 16 is provided in the exhaust outlet EX. However, there is no need to consider the placement of the reactor 51. It is possible to facilitate the defrosting of the frozen refrigerant by merely providing the shutter 16.

In the third embodiment, the shutter 16 is a bimetal shutter. However, the shutter 16 is not limited to this structure. The shutter 16 may be anything as long as it is a device which blocks the exhaust outlet EX at a temperature at which the refrigerant of the heat pipe cooler 9 is frozen. The exhaust outlet EX itself may have the blocking function. The shutter 16 is not limited to a device which opens and closes by itself like a bimetal shutter. The shutter 16 may be a device which opens and closes in accordance with the signal of the temperature sensor, etc. A function for outputting a command to conduct opening and closing operations to this kind of device may be provided in the controller 2.

It is to be noted that the present invention is not restricted to the foregoing embodiments, and constituent elements can be modified and changed into shapes without departing from the scope of the invention at an embodying stage. Additionally, various inventions can be formed by appropriately combining a plurality of constituent elements disclosed in the foregoing embodiments. For example, several constituent elements may be eliminated from all constituent elements disclosed in the embodiments. Furthermore, constituent elements in the different embodiments may be appropriately combined.

What is claimed is:

1. A power conversion apparatus comprising:
   a power conversion circuit including a heat source;
   a heat pipe cooler in which a refrigerant is enclosed, the heat pipe cooler being provided within the power conversion apparatus and configured to cool the heat source;
   a freeze determiner configured to determine whether the refrigerant is frozen; and
   an output limiter configured to limit output of the power conversion circuit when the freeze determiner determines that the refrigerant is frozen.

2. The power conversion apparatus of claim 1, wherein at least one device including the power conversion circuit is allocated so as to heat the heat pipe cooler.

3. The power conversion apparatus of claim 2, wherein the at least one device is allocated windward of air convection relative to the heat pipe cooler.

4. The power conversion apparatus of claim 3, further comprising
   an open/close unit which blocks an exhaust outlet discharging heat to outside the power conversion apparatus at a temperature at which the refrigerant is frozen.

5. The power conversion apparatus of claim 4, wherein the open/close unit is a bimetal shutter.

6. The power conversion apparatus of claim 2, further comprising
   an open/close unit which blocks an exhaust outlet discharging heat to outside the power conversion apparatus at a temperature at which the refrigerant is frozen.

7. The power conversion apparatus of claim 6, wherein the open/close unit is a bimetal shutter.

8. The power conversion apparatus of claim 1, further comprising
   an open/close unit which blocks an exhaust outlet discharging heat to outside the power conversion apparatus at a temperature at which the refrigerant is frozen.

9. The power conversion apparatus of claim 8, wherein the open/close unit is a bimetal shutter.

10. A controller for a power conversion apparatus which comprises a power conversion circuit including a heat source and cools the heat source by a heat pipe cooler in which a refrigerant is enclosed, the controller controlling the power conversion apparatus and comprising:
    a freeze determiner configured to determine whether the refrigerant is frozen; and
    an output limiter configured to limit output of the power conversion circuit when the freeze determiner determines that the refrigerant is frozen.

11. A method for controlling a power conversion apparatus which comprises a power conversion circuit including a heat source and cools the heat source by a heat pipe cooler in which a refrigerant is enclosed, the method comprising:
    determining whether the refrigerant is frozen; and
    limiting output of the power conversion circuit when the refrigerant is determined as frozen.

* * * * *